(12) United States Patent
Stumbo et al.

(10) Patent No.: US 7,701,428 B2
(45) Date of Patent: *Apr. 20, 2010

(54) INTEGRATED DISPLAYS USING NANOWIRE TRANSISTORS

(75) Inventors: Dave Stumbo, Belmont, CA (US); Stephen Empedocles, Menlo Park, CA (US)

(73) Assignee: Nanosys, Inc., Palo Alto, CA (US)

( * ) Notice: Subject to any disclaimer, the term of this patent is extended or adjusted under 35 U.S.C. 154(b) by 914 days.

This patent is subject to a terminal disclaimer.

(21) Appl. No.: 11/490,630

(22) Filed: Jul. 21, 2006

(65) Prior Publication Data

US 2006/0256059 A1 Nov. 16, 2006

Related U.S. Application Data

(63) Continuation of application No. 10/673,669, filed on Sep. 30, 2003, now Pat. No. 7,102,605.

(60) Provisional application No. 60/488,801, filed on Jul. 22, 2003, provisional application No. 60/414,323, filed on Sep. 30, 2002, provisional application No. 60/414,359, filed on Sep. 30, 2002, provisional application No. 60/468,276, filed on May 7, 2003.

(51) Int. Cl.
*G09G 3/36* (2006.01)
(52) U.S. Cl. .......................................... 345/87; 345/98
(58) Field of Classification Search ........... 345/87–100, 345/204
See application file for complete search history.

(56) References Cited

U.S. PATENT DOCUMENTS 5,747,928 A * 5/1998 Shanks et al. ................. 345/76
5,920,078 A 7/1999 Frey
5,962,863 A 10/1999 Russell et al.

(Continued)

FOREIGN PATENT DOCUMENTS

WO WO-0103208 1/2001

(Continued)

OTHER PUBLICATIONS

Chung, S-W. et al., "Silicon nanowire devices," *Appl. Phys. Lett* (2000) 76(15):2068-2070.

(Continued)

*Primary Examiner*—Regina Liang
(74) *Attorney, Agent, or Firm*—Jonathan Tuminaro; Andrew L. Filler

(57) ABSTRACT

The present invention is directed to a display using nanowire transistors. In particular, a liquid crystal display using nanowire pixel transistors, nanowire row transistors, nanowire column transistors and nanowire edge electronics is described. A nanowire pixel transistor is used to control the voltage applied across a pixel containing liquid crystals. A pair of nanowire row transistors is used to turn nanowire pixel transistors that are located along a row trace connected to the pair of nanowire row transistors on and off. Nanowire column transistors are used to apply a voltage across nanowire pixel transistors that are located along a column trace connected to a nanowire column transistor. Displays including organic light emitting diodes (OLED) displays, nanotube field effect displays, plasma displays, micromirror displays, micoelectromechanical (MEMs) displays, electrochromic displays and electrophoretic displays using nanowire transistors are also provided.

20 Claims, 7 Drawing Sheets

U.S. PATENT DOCUMENTS

| | | | |
|---|---|---|---|
| 6,140,993 A * | 10/2000 | Pathak et al. | 345/100 |
| 6,256,767 B1 | 7/2001 | Kuekes et al. | |
| 6,274,007 B1 | 8/2001 | Smirnov et al. | |
| 6,438,025 B1 | 8/2002 | Skarupo | |
| 6,447,663 B1 | 9/2002 | Lee et al. | |
| 6,566,704 B2 | 5/2003 | Choi et al. | |
| 6,586,785 B2 | 7/2003 | Flagan et al. | |
| 6,760,245 B2 | 7/2004 | Eaton et al. | |
| 6,798,000 B2 | 9/2004 | Luyken et al. | |
| 6,815,218 B1 | 11/2004 | Jacobson et al. | |
| 6,882,051 B2 | 4/2005 | Majumdar et al. | |
| 7,051,945 B2 | 5/2006 | Empedocles et al. | |
| 2001/0054709 A1 | 12/2001 | Heath et al. | |
| 2002/0024489 A1 | 2/2002 | Koyama et al. | |
| 2002/0117659 A1 | 8/2002 | Lieber et al. | |
| 2002/0127495 A1 | 9/2002 | Scherer | |
| 2002/0130311 A1 | 9/2002 | Lieber et al. | |
| 2002/0130353 A1 | 9/2002 | Lieber et al. | |
| 2002/0163079 A1 | 11/2002 | Awano | |
| 2002/0173083 A1 | 11/2002 | Avouris et al. | |
| 2002/0175408 A1 | 11/2002 | Majumdar et al. | |
| 2003/0012723 A1 | 1/2003 | Clarke | |
| 2003/0042562 A1 | 3/2003 | Giebeler et al. | |
| 2003/0089899 A1 | 5/2003 | Lieber et al. | |
| 2003/0132461 A1 | 7/2003 | Roesner et al. | |
| 2003/0186522 A1 | 10/2003 | Duan et al. | |
| 2003/0189202 A1 | 10/2003 | Li et al. | |
| 2004/0005258 A1 | 1/2004 | Fonash et al. | |
| 2004/0031975 A1 | 2/2004 | Kern et al. | |
| 2004/0036126 A1 | 2/2004 | Chau et al. | |
| 2004/0036128 A1 | 2/2004 | Zhang et al. | |
| 2004/0061422 A1 | 4/2004 | Avouris et al. | |
| 2005/0064618 A1 | 3/2005 | Brown et al. | |
| 2005/0079659 A1 | 4/2005 | Duan et al. | |
| 2007/0176824 A1 | 8/2007 | Stumbo et al. | |

FOREIGN PATENT DOCUMENTS

| | | |
|---|---|---|
| WO | WO-0217362 | 2/2002 |
| WO | WO-0248701 | 6/2002 |

OTHER PUBLICATIONS

Duan, X et al., "High-performance thin-film transistors using semiconductor nanowires and nanoribbons," *Nature* (2003) 425-274-278.

Tans, S.J. et al., "Room-temperature transistor based on a single carbon nanotube," *Nature* (1998) 393:49-52.

Tomita, S. et al., "Transistor sizing for AMLCD integrated TFT drive circuits," *J. SID* (1997) 5/4:399-404.

Yamada, T. "Analysis of submicron carbon nanotube field-effect transistors," *Appl. Phys. Lett.* (2000) 76(5):628-630.

King, T-J. *Homework Assignment #3 solutions, Handout #29*, University of California, College of Engineering, Department of Electrical Engineering and Computer Sciences, EE290D, 3 pages (Spring 1999).

6,976 Flat Panel Display Devices: Lecture 14, 32 pages of slides (date unknown).

Lecture 15: 6,976 Flat Panel Display Devices, 39 pages of slides (Spring 2001).

Lundstrom, D. et al., "Liquid Crystal Materials," 43 pages from http://www.kth.se/fakulteter/tfy/kmf/lcd/lcd~1.htm, (May 18, 1998).

Tyson, J. "How LCDs work" 7 pages from http://electronics.howstuffworks.com/lcd.htm/printable (1998).

* cited by examiner

US 7,701,428 B2

INTEGRATED DISPLAYS USING NANOWIRE TRANSISTORS

CROSS-REFERENCE TO RELATED APPLICATIONS

This application is a continuation of U.S. patent application Ser. No. 10/673,669, filed Sep. 30, 2003, now U.S. Pat. No. 7,102,605 which is hereby incorporated herein in its entirety; which claims the benefit of U.S. Provisional Application Nos. 60/488,801, filed Jul. 22, 2003, which is hereby incorporated herein in its entirety; 60/414,323, filed Sep. 30, 2002, which is hereby incorporated herein in its entirety; 60/414,359, filed Sep. 30, 2002, which is hereby incorporated herein in its entirety; and 60/468,276, filed May 7, 2003, which is hereby incorporated herein in its entirety.

BACKGROUND OF THE INVENTION

Field of the Invention

The present invention relates to displays, and more particularly, integrated displays using nanowire transistors.

A wide variety of display technologies exist. These display technologies include liquid crystal displays, organic light emitting diodes (OLED) displays, nanotube field effect displays, plasma displays, micromirror displays, micoelectromechanical (MEMs) displays, electrochromic displays and electrophoretic displays. Each of these display types has unique characteristics that make a display type more or less suitable for a particular display function (e.g. a computer display, a watch display). Nonetheless, each display type shares common features associated with a backplane that can include pixels, electronics to drive changes in the appearances of the pixels and a base substrate, such as glass. A detailed description of a liquid crystal display—one of the more common types of displays—is provided to highlight the characteristics of displays.

A liquid crystal display (LCD) is a display made of material whose reflectance or transmittance of light changes when an electric field is applied. Liquid crystal displays are used in a plethora of applications ranging from wristwatch displays to laptop computer displays to television screens. As the name suggests, fundamental components of an LCD are liquid crystals. Liquid crystals have several unique properties that make LCDs possible. One liquid crystal feature is that they are affected by electric fields. The most common form of liquid crystal used in LCDs is called a twisted nematic liquid crystal. As is well known by persons skilled in the relevant arts, these crystals respond predictably to the application of an electric field to control the amount of light passage through the crystal. Liquid crystals are arranged to form pixels within the display. A pixel is the smallest discrete element of an image on the LCD. Typically, the greater the number of pixels per unit area (e.g., square-inch) the greater the resolution.

Another critical element of LCDs, as well as the other display technologies, is the electronics used to control and drive the liquid crystals or the particular component used in a display technology (e.g., micromirrors, plasma, a nanotube, etc.). The complexity of the electronics varies greatly by the application and LCD type. For example, two common types of LCDs are passive and active matrix LCDs. Within a passive matrix LCD, a simple conductive grid is used to supply current to the liquid crystals that form the pixels. The grid is formed by columns and rows of transparent conductive material, typically indium-tin oxide. To turn on a pixel, a voltage is applied to a column and its negative is applied to a row that intersects at the designated pixel to deliver a field that untwists the liquid crystals at the pixel to allow light to be transmitted or reflected. The electronics to drive a passive matrix LCD are relatively simple. The tradeoff for the relatively simple electronics is that each pixel of a passive matrix LCDs has a duty cycle that gets smaller as the number of pixels increases. This results in slow response times and poor contrast. As a result, an LCD's ability to refresh an image can be slow and the images not crisp.

An active matrix LCD has more complex electronics to cause each pixel to have its electric field applied nearly one hundred percent of the time. This enables very short response times for exercising the liquid crystals, high contrast, and direct pixel addressing to make active matrix LCDs well suited for video and fast graphic application. An active matrix LCD depends on thin film transistors (TFT). Specifically, an independent TFT is associated with each and every pixel. Likewise, with other technologies the more complex they are, the more likely that they rely on TFTs.

FIG. 1 illustrates a typical active matrix LCD using TFTs, active matrix LCD 100. Active matrix LCD 100 includes polarizer film 110, upper glass substrate 120, color filter 130, transparent electrodes 140, liquid crystals 150, pixel transistors and traces 160, edge electronics 170, base glass substrate 180 and polarizer film 190. Collectively, the pixel transistors (and traces) 160, edge electronics (and traces) 170, and base glass substrate 180 can be referred to as a backplane, or in this case an active matrix backplane (i.e., the transparent (front) electrodes and the liquid crystal are not part of the backplane). The term active matrix backplane can also be used to refer to the above elements not including edge electronics 170. Each of these layers are sandwiched together to create an LCD display that can be used, for example, in a laptop computer display. In this case a frame would be added to support the LCD and affix the display to the laptop base. Circuitry would exist to enable communications from the laptop computer to the LCD to display the desired graphics or video.

When an image is to be displayed by active matrix display 100, electronic signals are sent using the TFTs and edge electronics to configure the liquid crystals located at the appropriate pixels such that no light or a certain fraction of the light is transmitted through the pixel. Edge electronics can include shift registers, level shifters that match an outside signal to a signal on a display and output buffers. FIG. 2 illustrates the layout of the TFT and edge electronics. FIG. 2 includes a set of thin film column transistors 210A through 210n, a set of thin film row transistors 220A through 220n, a set of conductive column traces 240A through 240n, a set of conductive row traces 250A through 250n, a set of thin film pixel transistors, such as thin film pixel transistor 230, and a set of pixels, such as pixel 260. A thin film pixel transistor, such as thin film pixel transistor 230 will be associated with the intersection of each row and column trace. A pixel is associated with each intersection of a row and column trace. Pixel 260 provides one example of a pixel. Thus, for example, when pixel 230 is to be addressed the appropriate signals are transmitted to thin film column transistor 210A, thin film row transistor 220A and thin film pixel transistor 260.

Currently, it is possible to use amorphous silicon thin film transistors (a-Si TFTs) or polycrsytalline silicon TFT (p-Si or poly-Si TFTs) or bulk-silicon transistors as the row, column, and pixel transistors in LCD displays, and a wide range of other types of displays. Use of these types of transistors imposes several design limitations on displays. First, the performance associated with transistors produced from a-Si or poly-Si is significantly less than those that use bulk silicon. The use of bulk silicon is often not feasible for pixel transistors, because the size of many commercially viable LCDs or other display types is greater than the size of the silicon wafers used to produce traditional bulk silicon transistors, and the cost of bulk silicon is too high for use as a pixel backplane. Additionally, because the LCD substrates must be clear, silicon wafers used to fabricate bulk silicon transistors can only be used as the substrate for reflective displays. Second, a-Si and poly-Si transistors do not have adequate performance for the row and column transistors, so that existing LCDs or other display types have a large number of interconnects around the edge of a panel to hook up row and column traces to external circuitry using crystalline silicon (i.e., bulk silicon) transistors in integrated circuits. These interconnects increase circuit and assembly complexity and interconnect failure, and decrease manufacturing yield. Third, the relatively large size of the a-Si and poly-Si circuitry and interconnects add weight to a display. Fourth, because of the relatively high temperatures needed to produce a-Si and poly-Si devices, the choice of transparent substrate is largely limited to the use of glass, high-temperature glass or quartz.

What is needed is circuitry that has improved performance characteristics that are comparable to those of circuitry using bulk silicon-based devices, but that can be applied over areas larger than a typical silicon wafer at a low cost and at a temperature compatible with a large number of transparent substrates.

What is also needed is circuitry that can be integrated within a LCD panel and other displays to reduce system complexity and weight.

What is also needed is circuitry that can be applied to flexible substrates, such as plastic.

SUMMARY OF THE INVENTION

The present invention is directed to displays using nanowire transistors. In particular, a liquid crystal display using nanowire pixel transistors, nanowire row transistors, nanowire column transistors and nanowire edge electronics is described. A nanowire pixel transistor is used to control the voltage applied across a pixel containing liquid crystals. A pair of nanowire row transistors is used to turn pixel transistors that are located along a row trace connected to the pair of nanowire row transistors on and off. Nanowire column transistors are used to supply a voltage to nanowire pixel transistors that are located along a column trace connected to a nanowire column transistor. Nanowire edge electronics are used to control row and column transistors. In alternative embodiments, a liquid crystal display using combinations of nanowire transistors and other forms of transistors for the pixel, row, and column transistors and edge electronics is presented. For example, a liquid crystal display is provided that uses amorphous silicon pixel transistors with nanowire transistors for row and column transistors. In an alternative embodiment of the invention, display technologies including organic light emitting diodes (OLED) displays, nanotube field effect displays, plasma displays, micromirror displays, micoelectromechanical (MEMs) displays, electrochromic displays and electrophoretic displays using nanowire transistors are also provided.

There are numerous benefits associated with the use of nanowire transistors within a display. First, nanowire transistors can be positioned on a multitude of substrates including glasses and plastics. As a result, displays can be developed on flexible substrates that open up a plethora of applications using flexible and/or rollable displays. Second, nanowire transistors have superior performance when compared to a-Si and poly-Si TFTs, thereby allowing the edge electronics associated with the row and column transistors to be integrated between the row and column traces. This allows displays, in particular LCDs, to be produced with an increased ratio of screen size to frame size for holding the screen and reduces the complexity of external control circuitry. Furthermore, because nanowire transistors are small they reduce obscuration associated with conventional a-Si and poly Si TFTs that is typically quite poor, since the larger a-Si and poly Si TFTs tend to block a significant portion of the light being reflected or transmitted through a display, such as an LCD. For emissive displays like OLEDs, smaller transistors allow a larger portion of the backplane area to be occupied by the OLEDs constructed directly on the backplane, rather than the more difficult process of building the OLEDs on top of the pixel transistor Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

Figure 1:
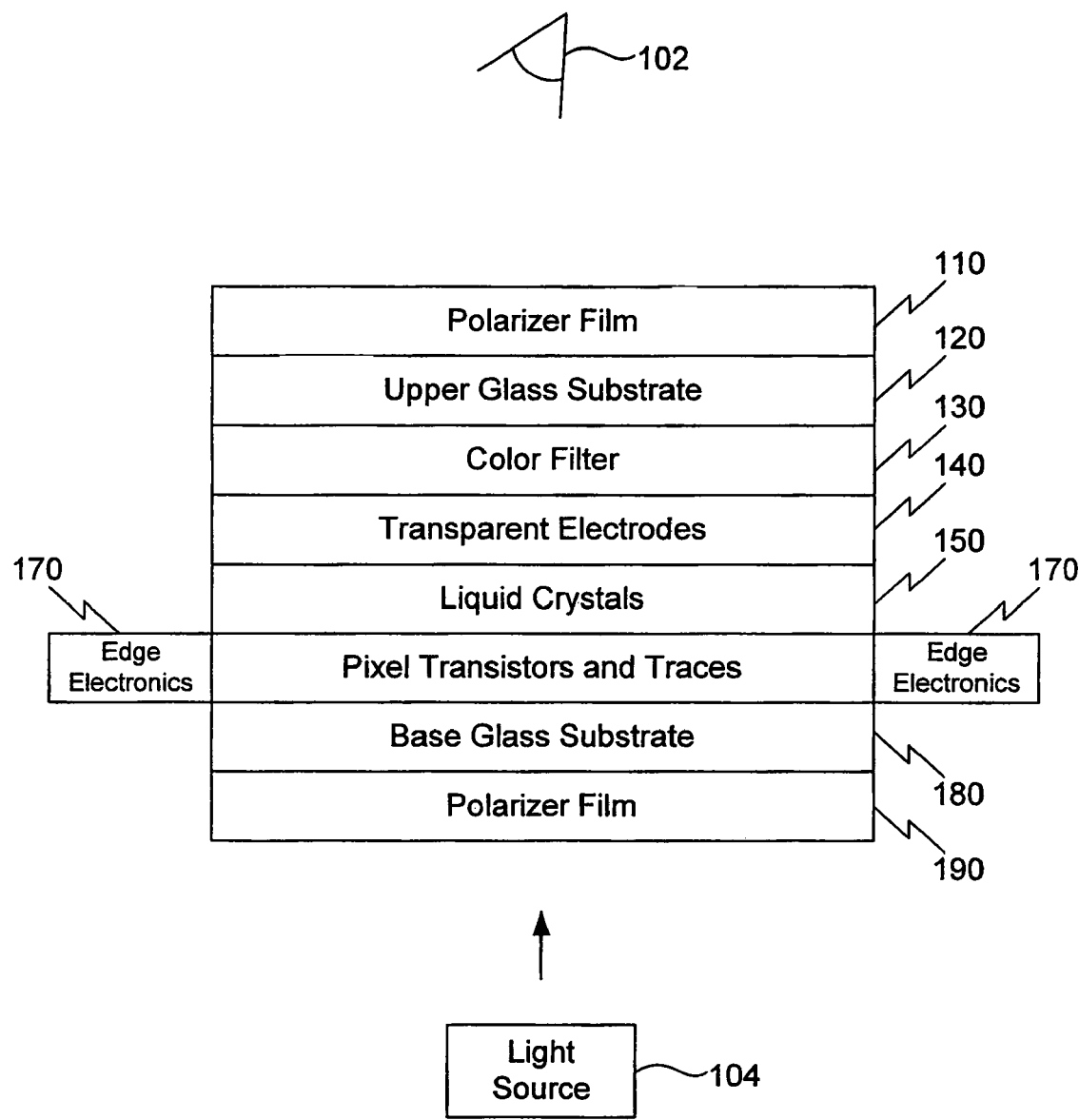
FIG. 1 is a diagram of an active matrix LCD.
Figure 2:
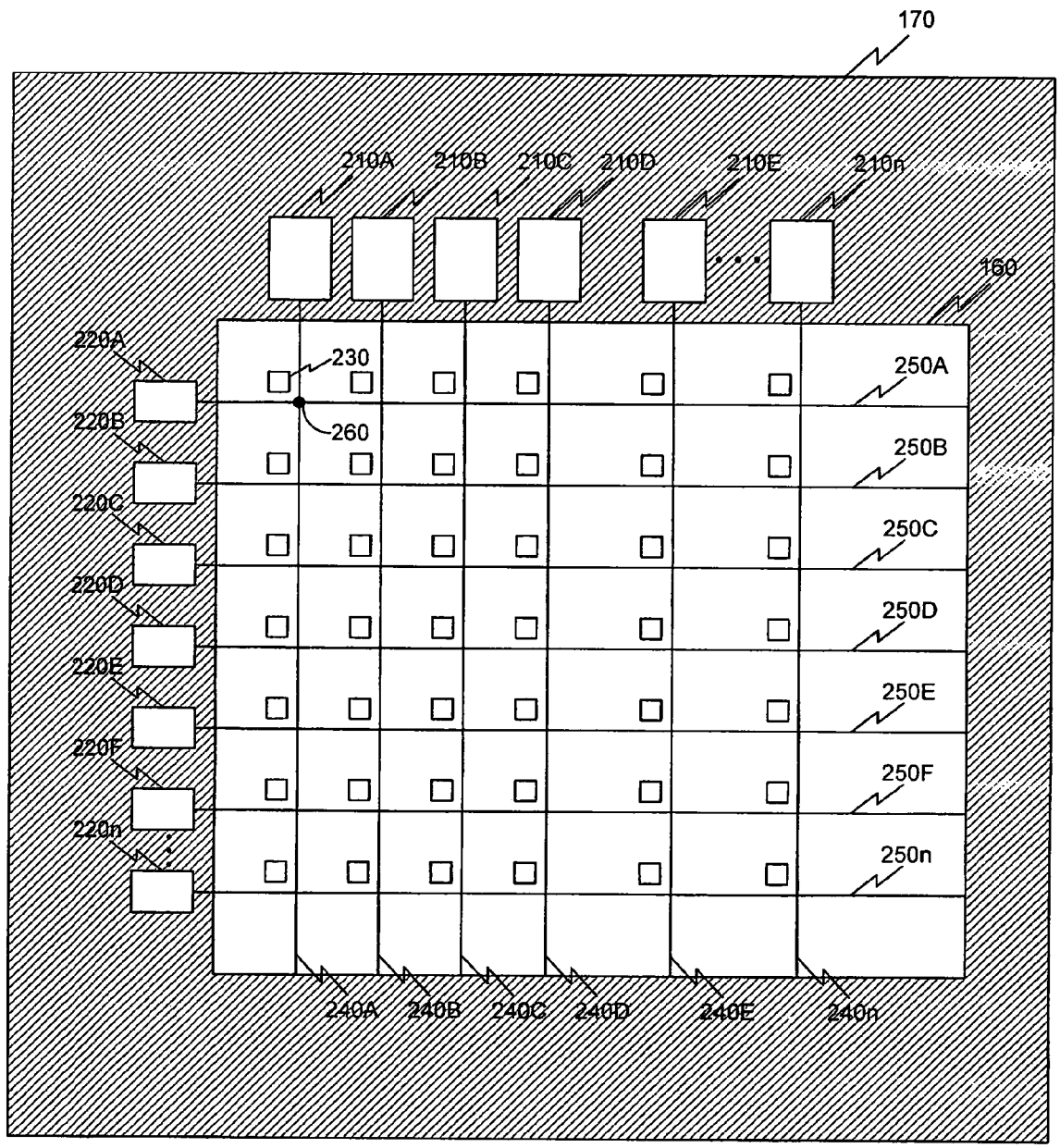
FIG. 2 is a diagram of TFT and edge electronics used to address pixels within an LCD.

It should be appreciated that the particular implementations described herein are examples of the invention and are not intended to otherwise limit the scope of the present invention in any way. Indeed, for the sake of brevity, conventional electronics, manufacturing, semiconductor devices, and nanotube, nanorod, nanowire and nanoribbon technologies and other functional aspects of the systems (and components of the individual operating components of the systems) may not be described in detail herein. Moreover, while the number of nanowires and spacing of those nanowires are provided for the specific implementations discussed, the implementations are not intended to be limiting and a wide range of the number of nanowires and spacing can also be used. Furthermore, dimensions and compositions of the nanowires can be varied. The implementations described are not intended to be limiting and a wide range of dimensions and compositions can be used.

As used herein, the term "nanowire" generally refers to any elongated conductive or semiconductive material that includes at least one cross sectional dimension that is less than 500 nm, and preferably, less than 100 nm, and has an aspect ratio (length:width) of greater than 10, preferably, greater than 50, and more preferably, greater than 100. Examples of such nanowires include semiconductor nanowires as described in Published International Patent Application Nos. WO 02/17362, WO 02/48701, and 01/03208, carbon nanotubes, and other elongated conductive or semiconductive structures of like dimensions.

While the LCD model described herein principally is based on properties associated with Si. Other types of nanowires can be used including semiconductive nanowires that are comprised of semiconductor material selected from, e.g., Si, Ge, Sn, Se, Te, B, C (including diamond), P, B—C, B—P (BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN2, $CaCN_2$, $ZnGeP_2$, $CdSnAs_2$, $ZnSnSb_2$, $CuGeP_3$, $CuSi_2P_3$, $(Cu, Ag)(Al, Ga, In, Tl, Fe)(S, Se, Te)_2$, $Si_3N_4$, $Ge_3N_4$, $Al_2O_3$, $(Al, Ga, In)_2 (S, Se, Te)_3$, $Al_2CO$, and an appropriate combination of two or more such semiconductors.

In certain aspects, the semiconductor may comprise a dopant from a group comprising: a p-type dopant from Group III of the periodic table; an n-type dopant from Group V of the periodic table; a p-type dopant selected from a group comprising: B, Al and In; an n-type dopant selected from a group comprising: P, As and Sb; a p-type dopant from Group II of the periodic table; a p-type dopant selected from a group comprising: Mg, Zn, Cd and Hg; a p-type dopant from Group IV of the periodic table; a p-type dopant selected from a group comprising: C and Si; or an n-type is selected from a group comprising: Si, Ge, Sn, S, Se and Te. Other known semiconductor dopants can be used, as would be apparent to persons having ordinary skill in the art.

Additionally, the nanowires can include carbon nanotubes, or conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes. Nanotubes can be formed in combinations/thin films of nanotubes as is described herein for nanowires, alone or in combination with nanowires, to provide the properties and advantages described herein. In addition, nanotubes need not comprise purely carbon, but can contain other materials such as boron or the like, as will be recognized by one of skill in the art.

Furthermore, it is noted that a thin film of nanowires of the present invention can be a "heterogeneous" film, which incorporates semiconductor nanowires and/or nanotubes, and/or different compositions of nanowires, and/or any combination thereof of different composition and/or structural characteristics. For example, a "heterogeneous film" can includes nanowires/nanotubes with varying diameters and lengths, and nanotubes and/or nanotubes that are "heterostructures" having varying characteristics.

By substantially "aligned" or "oriented" is meant that the longitudinal axes of a majority of nanowires in a collection or population of nanowires is oriented within 30 degrees of a single direction. Although the majority can be considered to be a number of nanowires greater than 50%, in various embodiments, 60%, 75%, 80%, 90%, or other percentage of nanowires can be considered to be a majority that are so oriented. In certain preferred aspects, the majority of nanowires are oriented within 10 degrees of the desired direction. In additional embodiments, the majority of nanowires can be oriented within other numbers or ranges of degrees of the desired direction, including randomly or isotropically oriented.

It should be understood that the spatial descriptions (e.g., "above", "below", "up", "down", "top", "bottom", etc.) made herein are for purposes of illustration only, and that devices of the present invention can be spatially arranged in any orientation or manner.

Finally, while the discussion focuses on an exampled display type of an LCD, the invention applies to any type of display technology that has a backplane with electronics to drive changes in pixels, including, but not limited to organic light emitting diodes (OLED) displays, nanocrystal-doped OLEDs, nanotube field effect displays, plasma displays, micromirror displays, micoelectromechanical (MEMs) displays, electrophoretic displays and the like.

Figure 3A:
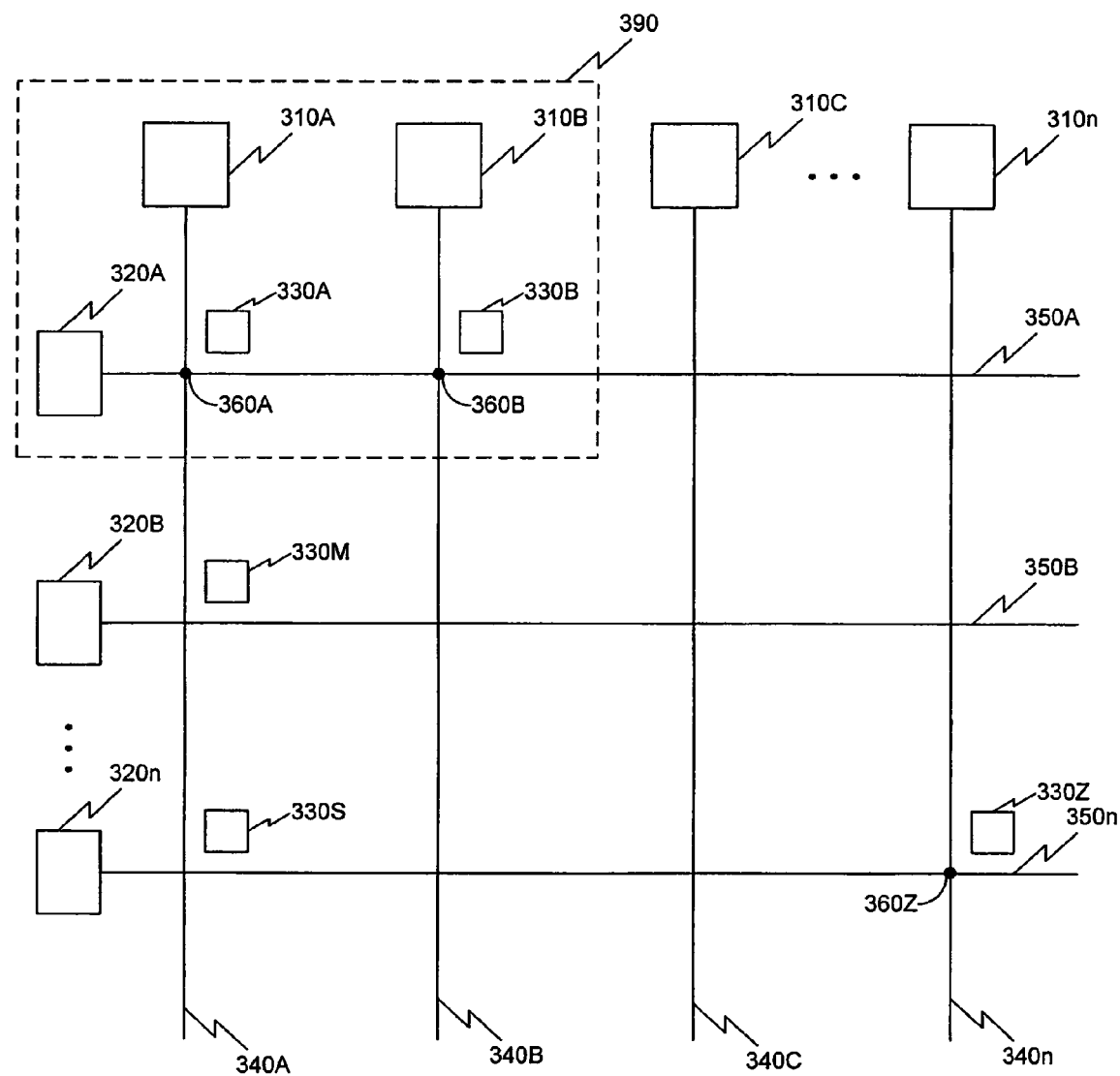
FIG. 3A is a diagram of a LCD using nanowire transistors, according to an embodiment of the invention.

FIG. 3A provides LCD 300 using nanowire transistors, according to an embodiment of the invention. LCD 300 includes a set of nanowire column transistors 310A through 310n, a set of nanowire row transistor pairs 320A through 320n, a set of nanowire pixel transistors 330A through 330z, a set of conductive column traces 340A through 340n, a set of row traces 350A through 350n, and a set of pixels 360A through 360z. Each nanowire column transistor is coupled to a set of nanowire pixel transistors along a column trace extending from the nanowire column transistor. For example, nanowire column transistor 310A is coupled to nanowire pixel transistors 330A, 330M, and 330S along column trace 340A. Each nanowire row transistor pair is coupled to a set of nanowire pixel transistors along a row trace extending from the nanowire row transistor. For example, nanowire row transistor pair 320A is coupled to a set of nanowire pixel transistors along row trace 350A. A nanowire pixel transistor is associated with a corresponding pixel. For example, nanowire pixel transistor 330A is associated with pixel 360A.

In addition, nanowire edge electronics (not shown in FIG. 3A) can be used to control the nanowire column, row and pixel transistors. Nanowire edge electronics can also be used to drive column, row and pixel transistors that are now made using nanowires. Nanowire edge electronics can include nanowire shift registers, nanowire level shifters and nanowire buffers. Nanowire shift register refers to a shift register implemented using nanowire transistors. Nanowire level shifter refers to level shifters implemented using nanowire transistors. Nanowire buffer refers to a buffer implemented using nanowire shifters. Other types of edge electronics can be implemented using nanowire transistors.

In operation, when the intensity of a pixel is to be changed, a voltage is applied to a nanowire column transistor for the column in which the pixel is located. The nanowire row transistor for the row in which the pixel is located will be turned on to allow current to flow to the nanowire pixel transistor. When the nanowire pixel transistor is on, current flows through the nanowire pixel transistor to make the voltage across the pixel, approximately the same as the voltage applied on the column to generate the desired intensity of light being transmitted through the pixel.

While FIG. 3A demonstrates an embodiment in which column, row and pixel transistors are nanowire transistors. In alternate embodiments any combination of nanowire transistors and a-Si or poly-Si transistors can be used for the column, row and pixel transistors. For example, in one embodiment the pixel transistors can be a-Si TFTs or poly-Si TFTs and the row and column transistors can be nanowire transistors. This may be an appealing alternative because the performance requirements for the pixel transistors are relatively low, and can be easily met by a-Si TFTs. In another example, the column transistors can be a-Si or poly-Si TFTs and the row and pixel transistors can be nanowire transistors. In another example, the row transistors can be a-Si or poly-Si TFTs, and the column and pixel transistors can be nanowire transistors. In another example, the pixel transistors and row transistors can be a-Si or poly-Si TFTs, and the column transistors can be nanowire transistors. In another example the pixel transistors and column transistors can be a-Si or poly-Si TFTs, and the row transistors can be nanowire transistors.

Figure 3B:
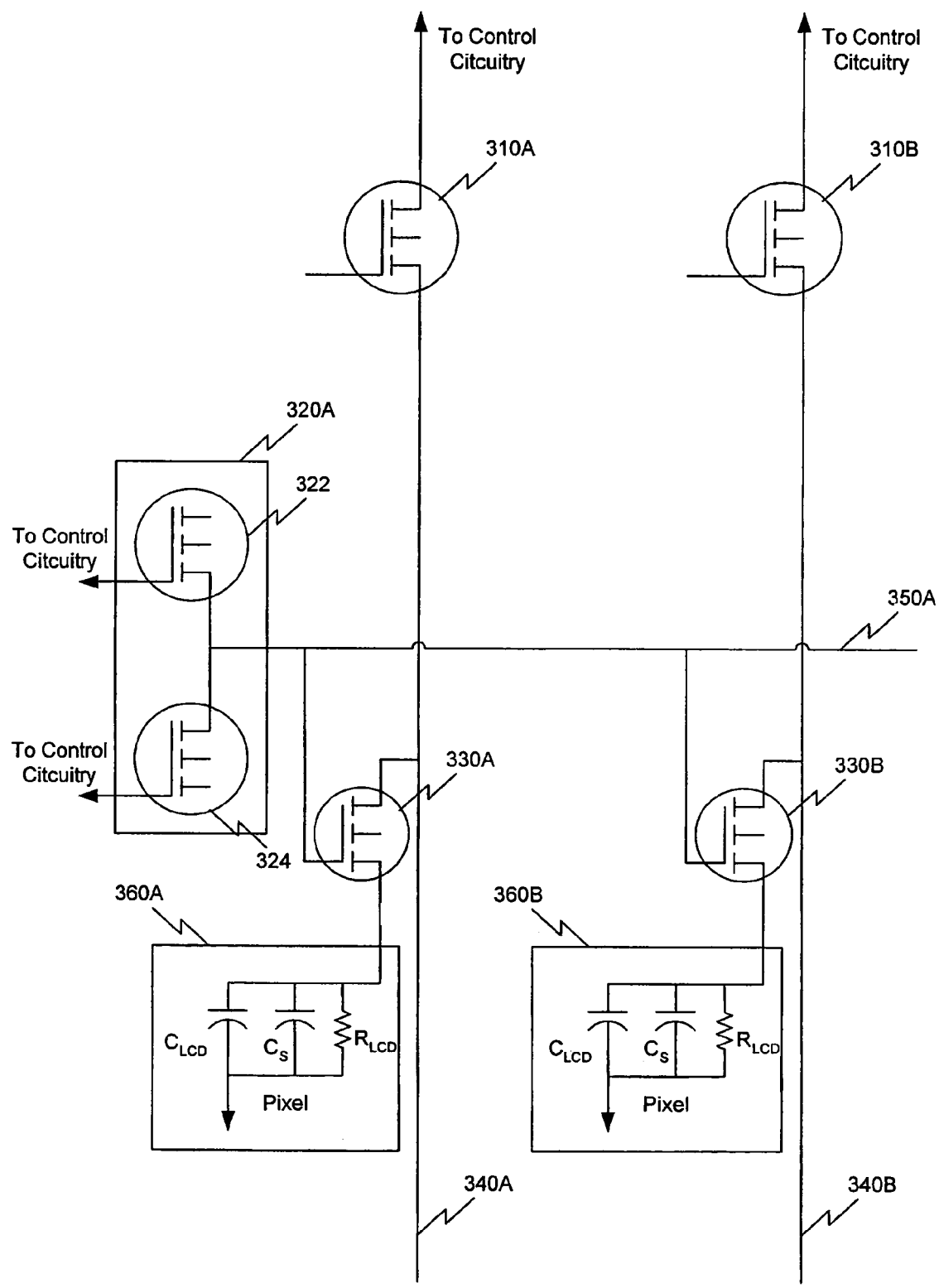
FIG. 3B is a diagram of a detailed portion of an LCD using nanowire transistors, according to an embodiment of the invention.

FIG. 3B provides a more detailed view of a portion 390 of LCD 300, according to an embodiment of the invention. FIG. 3B highlights a number of aspects of an LCD using nanowire transistors, namely that a pair of nanowire row transistors will be coupled to each row trace and that each pixel has resistance and capacitance associated with it that impact the design considerations for the transistors. It should be noted that the row and column traces will also have resistance and capacitance associated with them that impact the design criteria. Nanowire row transistors 322 and 324 form nanowire row transistor pair 320A, and are coupled to nanowire pixel transistors 330A and 330B over row trace 350A. As described with respect to FIG. 5 below in more detail, nanowire row transistors 322 and 324 are used to turn nanowire pixel transistors, such as nanowire pixel transistor 330A and 330B on and off.

Additionally, FIG. 3B illustrates that each pixel will have a capacitance and resistance associated with the pixel. For example, pixel 360A includes capacitance $C_{lcd}$, capacitance $C_s$ and resistance $R_{lcd}$. Capacitance $C_{lcd}$ represents the capacitance associated with liquid crystals within pixel 360A. Resistance $R_{lcd}$ represents the resistance associated with liquid crystals within pixel 360A. Capacitance $C_s$ is a storage capacitance that is added to improve performance.

Based on the teachings herein, a person skilled in the relevant arts will be enabled to incorporate nanowire transistors into an LCD without undue experimentation. Furthermore, while the design tool demonstrates the use of a particular type of nanowire transistor, the example is not intended to be limiting. Rather individuals skilled in the relevant arts will be able to apply the teachings herein and the concepts used within the design tool discussed below to develop integrated LCDs or other display types with a wide range of nanowire semiconductors with varying characteristics, such as type of nanocrystal materials, doping, number of wires and orientation.

The inventors developed a nanowire LCD design tool to demonstrate the feasibility of using nanowire transistors for the electronics driving the liquid crystals within pixels of an LCD. The tool includes a user interface, an LCD design input element, a nanowire characteristics input element, a transistor requirements engine, and a nanowire design engine. The user interface enables a user to enter design criteria and displays results. The LCD design input element gathers information about the type of LCD (e.g. LCD size, pixel density, etc.). The nanowire characteristics input element gathers information about nanowire characteristics, including size, nanowire crystal material, doping, and related performance characteristics. The transistor requirements engine generates the performance requirements needed for the row, column and pixel transistors. The nanowire design engine receives as an input the output of the transistor requirements engine and determines the type of nanowire transistor needed for the particular application.

The nanowire LCD design tool was used to demonstrate that nanowire transistors can be used to drive pixels within an LCD. The use of the tool also facilitated the identification of unique benefits associated with the use of nanowire transistors within an LCD.

In the analysis, conservative assumptions were used for the nanowire characteristics. In particular, a surface mobility ($\mu_s$) of about one half the typical values of bulk silicon was used with a standard fit for ($\mu_s$) versus doping to account for a reduction in mobility associated with doping. The doping assumptions were that $Na=10^{17}/cm^3$ in the channel where the gate controls the conductance of the transistor and $Nd=10^{19}/cm^3$ in the source and drain where there is no gate control. The length of the channel, source and drain were each assumed to be 10 μm. These assumptions were conservative to ensure that the lowest cost lithography could be used.

Additionally, a circumferential gate was assumed to be used, which means that the gate contact surrounds the nanowire. Furthermore, it was assumed that the nanowires would have a core shell design, with silicon oxide grown around a nanowire core and a gate applied around the oxide. Using this approach, a 60 nm diameter silicon core nanowire was assumed with a 40 nm think $SiO_2$ shell, such that the nanowire had a 140 nm total diameter. Finally, conservative threshold and driving voltage were assumed, such that the threshold voltage ($V_t$) was assumed to be two volts and the driving voltage ($V_d$) was assumed to be five volts. Driving voltages for a-Si and poly-Si transistors are typically higher. The voltages assumptions used are more in line with voltages used within typical integrated circuits. U.S. Provisional Appl. Nos. 60/414,323, filed Sep. 30, 2002 and 60/468,276, filed May 7, 2003, which are incorporated by reference herein in their entirety, describe nanowire semiconductors and provide performance data that support these assumptions. Note that similar backplane electronics can be fabricated without the need for a conformal gate and/or conformal gate-oxide.

The LCD panel assumptions are based on typical characteristics of existing LCD panels. In particular, the LCD panel was assumed to have a 21 inch diagonal display with a resolution of 1024×768 RGB pixels with a 60 Hz refresh rate. For each RGB pixel, three pixels (red, green and blue) exist. Therefore, the column pitch would be approximately 110 μm and the row pitch would be approximately 330 μm. A capacitance of one pF was assumed to be associated with each pixel. The row traces were assumed to be aluminum (Al) that was 10 μm wide and 1 μm thick. The row insulation was assumed to be made from $SiO_2$ that was greater than 0.5 μm thick. The column traces were assumed also to be Al that was 10 μm wide and 2 μm thick. The column insulation was assumed to be made from $SiO_2$ that was greater than 2 μm thick. The choice of parameters for the row and column traces determines the resistance and capacitance of the traces. In turn, the trace resistance and capacitance, along with the pixel and transistor capacitances and resistances, determines how fast the line can be switched, and what level of performance is needed within the row, column and pixel transistors.

Based on these LCD criteria, the tool produced outputs that defined the requirements for the column, row and pixel transistors. Methods to size TFT transistors will be known by individuals skilled in the relevant arts. See, e.g., Satoru Tomita et al., *Transistor Sizing for AMLCD Integrated TFT Drive Circuits*, Journal of the Society of Information Display 5/4, 1997 at 339-404. Specifically, for the pixel transistors the model determined that an on resistance less than 1.6 MOhms would be needed, and an off resistance greater than 835 GOhms would be needed for the pixel transistors. Determination of the on and off resistance are based on a variety of factors. In particular, the off resistance needs to be high to avoid the undesirable effect of flicker within the pixels. To avoid flicker, the capacitance voltage across the pixel has to coast for the 16.6 ms between refreshes (assuming a 60 Hz refresh rate) without significant leakage. The leakage rate is a function of the off resistance of the nanowire pixel transistor. Leakage in the LCD resistance or the transistor will cause the voltage on the pixel to change during refreshes, which can induce an undesirable flicker in the pixel. For the purposes of the analysis, it was assumed that the voltage on the pixel should not change by more than 10% between refreshes. On the other hand, the on-resistance needs to be low enough to allow the pixel to charge in the time available. Factoring in these criteria led to the on-and off-resistances mentioned above.

Once these resistances are known, the number of nanowires needed for the transistors can be determined. The tool determined that for the assumptions used, a nanowire pixel transistor with as few as one nanowire can satisfy the design constraints. More than one nanowire is also acceptable.

Figure 4:
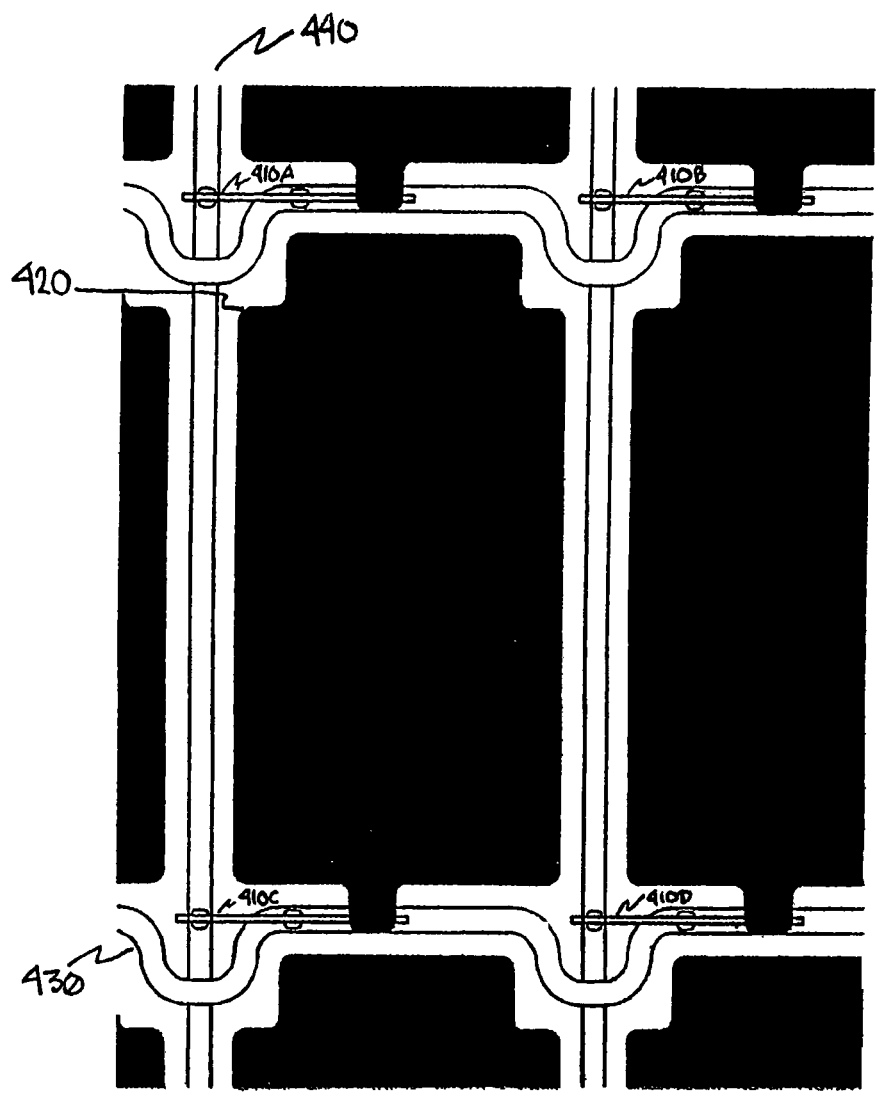
FIG. 4 is a diagram of four nanowire pixel transistors within an LCD, according to an embodiment of the invention.

FIG. 4 provides a diagram of four nanowire pixel transistors within an LCD, according to an embodiment of the invention. As suggested by the analysis results, the diagram illustrates the use of one-wire nanowire pixel transistors. The portion of the LCD shown includes four one-wire nanowire pixel transistors 410A, 410B, 410C, and 410D; portions of several pixels including green pixel 420; row trace 430, and column trace 440. Nanowire pixel transistor 410C has one end connected to a transparent conductor, for example indium tin oxide, associated with green pixel 420. The indium tin oxide conductor is used to apply a voltage to one side of the liquid crystal cell. The other end of nanowire pixel transistor is connected to column trace 440. On a point between these connection points, nanowire pixel transistor 410C is connected to row trace 430. This connection point serves as the gate for nanowire pixel transistor 410C. The basic concept is that a voltage applied to row trace 430 will turn nanowire pixel transistor 410C on and off. In alternative embodiments, more than one nanowire can be used within the nanowire pixel transistors.

The analysis also produced design results for nanowire row transistors that demonstrated the feasibility of using nanowire transistors as row transistors. Use of the tool determined that the current design requirements for a row transistor can be satisfied with a nanowire transistor that contains at least 150 nanowires. Another consideration that was examined was whether a pair of nanowire row transistors would fit between two row traces. The model calculations demonstrated that the size of the pair of nanowire row transistors would be significantly less than the distance (less than about 4-10%) between row traces, thus the nanowire transistors can easily be placed between row traces.

In alternative embodiments, higher-mobility nanowires can be used, thus requiring fewer nanowires per transistor. Additionally, these numbers would be scaled depending on the desired pixel size.

Figure 5:
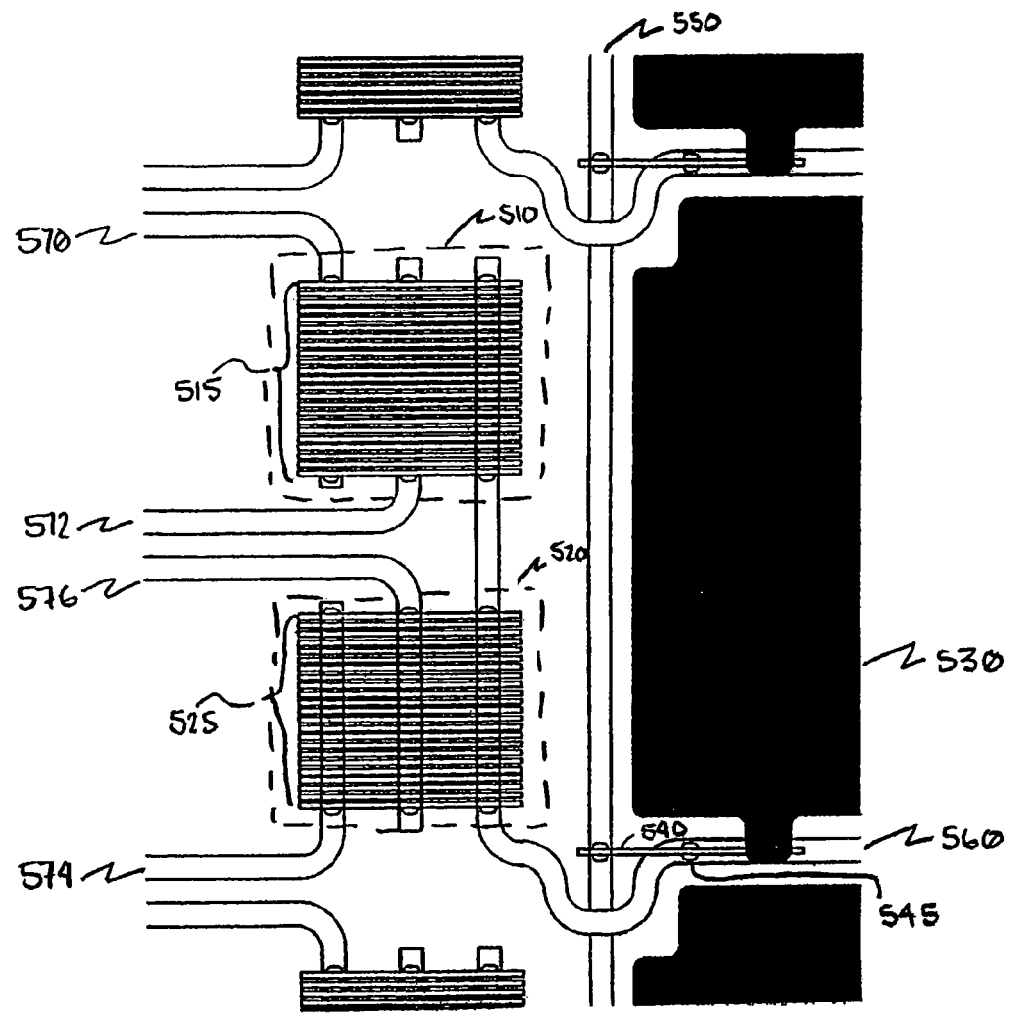
FIG. 5 is a diagram of a pair of nanowire row transistors within an LCD, according to an embodiment of the invention.

FIG. 5 provides a diagram of a pair of nanowire row transistors within an LCD, according to an embodiment of the invention. The diagram includes nanowire row transistor 510, nanowire row transistor 520, pixel 530, nanowire pixel transistor 540, column trace 550, row trace 560, high trace 570, gate trace 572, low trace 574, and gate trace 576. Nanowire row transistor 510 includes set of nanowires 515. Likewise nanowire row transistor 520 includes set of nanowires 525. Nanowire row transistors 510 and 520 are used to turn nanowire pixel transistor 540 on and off.

Nanowire row transistor 510 has one side of the set of nanowires 515 coupled to row trace 560 and the other side coupled to high trace 570. High trace 570 is connected to an on voltage. A point on each nanowire between these connections on the set of nanowires 515 that collectively serve as the transistor gate is connected to gate trace 572.

Nanowire row transistor 520 has one side of the set of nanowires 525 coupled to row trace 560 and the other side coupled to low trace 574. Low trace 574 is connected to a ground. A point on each nanowire between these connections on the set of nanowires 525 that collectively serve as the transistor gate is connected to gate trace 576.

When nanowire pixel transistor 560 is to be turned on, a gate voltage is applied over gate trace 572 to turn nanowire row transistor 510 on. At the same time a ground is applied over gate trace 576 to turn nanowire row transistor 520 off. As a result, a gate voltage is connected to nanowire pixel transistor gate 545 to turn nanowire pixel transistor 540 on. When nanowire pixel transistor 510 is to be turned off, the opposite occurs. The gate voltage is removed from gate trace 572 to turn nanowire row transistor 510 off. And, at the same time a gate voltage is applied to gate trace 576 to turn nanowire row transistor 520 on. As a result, the gate voltage of nanowire pixel transistor gate 545 is driven to ground to turn nanowire pixel transistor 540 off.

The analysis also produced design results for nanowire column transistors that demonstrated the feasibility of using nanowire transistors as column transistors. Use of the tool determined that the current design requirements can be satisfied with a nanowire transistor that contains at least 3000 nanowires. More nanowires are required for column transistors than the other types of transistors, because column transistors are required to have a lower on-resistance since they have a short period of time to charge and the column lines have a significant amount of capacitance. As in the case of the nanowire row transistors, the tool demonstrated that the nanowire transistors would fit between column traces. In each case, the specific number of nanowires required to meet the performance criteria will be impacted by the type of nanocrystal material, the doping levels and other factors, as discussed above.

Figure 6:
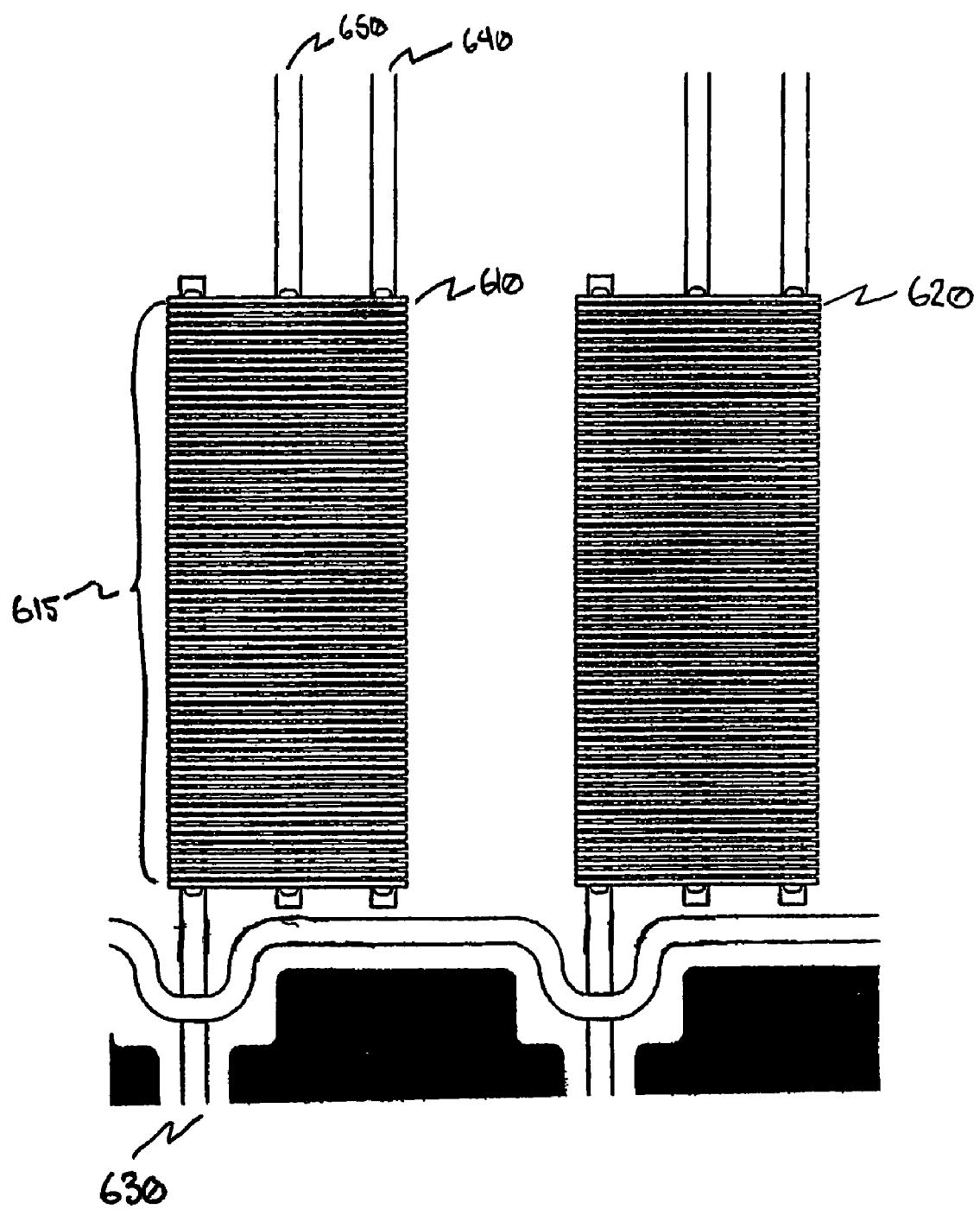
FIG. 6 is a diagram of two-nanowire column transistors within an LCD, according to an embodiment of the invention.

FIG. 6 provides a diagram of two nanowire column transistors within an LCD, according to an embodiment of the invention. The diagram includes nanowire column transistor 610, nanowire column transistor 620, column trace 630, video trace 640, and gate trace 650. Nanowire column transistor 610 includes set of nanowires 615. Nanowire column transistor 610 can be used to apply a voltage to nanowire pixel transistors that are coupled to column trace 630.

Nanowire column transistor 610 has one side of the set of nanowires 615 coupled to column trace 630 and the other side coupled to video trace 640. Video trace 640 is connected to a high voltage used to drive nanowire pixel transistors coupled to column trace 630. This video voltage sets the pixel voltage and hence the brightness of the pixel. A point on each nanowire between these connections on the set of nanowires 615 that collectively serve as the transistor gate is connected to gate trace 650. Gate trace 650 is connected to control circuitry used to turn columns of pixels on and off.

As can be observed from FIGS. 3A, 3B, 4, 5, and 6 the nanowires can be deposited in one direction. That is, in this case all nanowires are horizontal, making the deposition of the nanowires onto a substrate easier than if the nanowires were in multiple directions. U.S. Provisional Appl. No. 60/414,323, filed Sep. 30, 2002 describes methods to achieve this type of positioning. Additionally, nanowires can be deposited in other directions depending on the specific design criteria. Furthermore, the number of nanowires used to form a pixel, row or column transistor will be a function of design criteria, but can include, but is not limited to more than two nanowires, more than ten nanowires, more than one hundred nanowires and more than one thousand nanowires.

Furthermore, displays that use nanowire transistors can be formed on a base substrate, such as base glass substrate 180, with a wide range of characteristics. Specifically, the material for the base substrate can include, but is not limited to glass, plastic, a polymer, crystal, metal, or paper. Additionally, the material characteristics for the base substrate can include, but are not limited to being a transparent material, a translucent material, an opaque material, a colored material, a material that polarizes incident light, and a material that does not polarize incident light. Finally, the material for the base substrate can be a "low temperature" material that has a melting temperature that can include, but is not limited to, a temperature below 500 degrees Fahrenheit, below 300 degrees Fahrenheit, below 200 degrees Fahrenheit, and below 100 degrees Fahrenheit.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. An active matrix backplane used within a display, comprising:
   a plurality of pixels;
   a plurality of column transistors, wherein a column transistor within said plurality of column transistors applies a voltage across a subset of a plurality of pixel transistors;
   a plurality of row transistors, wherein at least two row transistors within said plurality of row transistors turns a corresponding pixel transistor on and off;
   a plurality of pixel transistors, wherein a pixel transistor within said plurality of pixel transistors controls a corresponding pixel within said plurality of pixels; and
   edge electronics that control one or more of said column transistors, said row transistors, and said pixel transistors, wherein said edge electronics comprises a plurality of nanowire transistors each comprising a plurality of nanowires extending between a first source electrode and a first drain electrode of the transistor.

2. The active matrix backplane of claim 1, wherein said edge electronics include nanowire buffers.

3. The active matrix backplane of claim 1, wherein said edge electronics include nanowire shift registers.

4. The active matrix backplane of claim 1, wherein said edge electronics include nanowire level shifters.

5. The active matrix backplane of claim 1, wherein the display is a liquid crystal display.

6. The active matrix backplane of claim 1, wherein the display is an organic light emitting display (OLED).

7. The active matrix backplane of claim 6, wherein said OLED includes nanocrystals.

8. The active matrix backplane of claim 1, wherein the display is an electrophoretic display.

9. The active matrix backplane of claim 1, wherein the display is a plasma display.

10. The active matrix backplane of claim 1, wherein the display is an electrochromic display.

11. The active matrix backplane of claim 1, wherein the display is a microelectromechanical (MEMs) display.

12. The active matrix backplane of claim 1, wherein the display is a micromirror display.

13. The active matrix backplane of claim 1, wherein the display is a field emission display.

14. The active matrix backplane of claim 1, wherein the display is rigid.

15. The active matrix backplane of claim 1, wherein the display is flexible.

16. The active matrix backplane of claim 1, wherein the display is non-planar.

17. The active matrix backplane of claim 1, wherein each nanowire transistor comprises at least one hundred nanowires extending at least between a source and a drain electrode.

18. The active matrix backplane of claim 1, wherein each nanowire within each nanowire transistor comprises silicon nanowires.

19. The active matrix backplane of claim 18, wherein each silicon nanowire comprises a shell of $SiO_2$.

20. The active matrix backplane of claim 1, wherein each of said column transistors, said row transistors, and said pixel transistors comprise nanowire transistors.

* * * * *